(12) United States Patent
Miyairi et al.

(10) Patent No.: US 9,631,797 B2
(45) Date of Patent: Apr. 25, 2017

(54) LIGHT EMITTING DEVICE AND LIGHTING FIXTURE

(71) Applicant: NICHIA CORPORATION, Anan-shi, Tokushima (JP)

(72) Inventors: Hiroshi Miyairi, Yokohama (JP); Takayuki Igarashi, Yokohama (JP); Masato Fujitomo, Yokohama (JP); Satoshi Shirahama, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 66 days.

(21) Appl. No.: 14/546,042

(22) Filed: Nov. 18, 2014

(65) Prior Publication Data
US 2015/0153034 A1 Jun. 4, 2015

(30) Foreign Application Priority Data

Nov. 29, 2013 (JP) .................................. 2013-248394
Sep. 18, 2014 (JP) .................................. 2014-190302

(51) Int. Cl.
| F21V 19/00 | (2006.01) |
| F21V 29/70 | (2015.01) |
| F21V 29/74 | (2015.01) |
| F21V 29/505 | (2015.01) |
| F21Y 101/00 | (2016.01) |

(52) U.S. Cl.
CPC ........ *F21V 19/003* (2013.01); *F21V 19/0055* (2013.01); *F21V 29/70* (2015.01); *F21V 29/74* (2015.01); *F21V 29/505* (2015.01); *F21Y 2101/00* (2013.01); *H01L 2224/48137* (2013.01); *H01L 2224/8592* (2013.01); *H01L 2924/181* (2013.01); *H01L 2924/19107* (2013.01)

(58) Field of Classification Search
CPC ...... F21V 29/503; F21V 29/70; F21V 19/003; F21V 29/713; F21K 9/30; F21K 9/135
USPC ....................................................... 362/217.1
See application file for complete search history.

(56) References Cited

U.S. PATENT DOCUMENTS

| 2011/0193109 A1* | 8/2011 | Loh ........................... F21K 9/30 257/89 |
| 2012/0007076 A1 | 1/2012 | Cho |
| 2013/0146937 A1 | 6/2013 | Omura et al. |

FOREIGN PATENT DOCUMENTS

| JP | 2006-310138 A | 11/2006 |
| JP | 2008-218761 A | 9/2008 |
| JP | 2009-071013 A | 4/2009 |
| JP | 2012-094842 A | 5/2012 |
| JP | 2013-038430 A | 2/2013 |

* cited by examiner

*Primary Examiner* — Karabi Guharay
(74) *Attorney, Agent, or Firm* — Global IP Counselors, LLP

(57) ABSTRACT

A light emitting device has a plurality of light emitting elements, a heat spreading member on which the plurality of light emitting elements are mounted, and having a bottom face, an insulating member having a recess that includes side walls and a bottom wall, a top face of the bottom wall being in contact with the bottom face of the heat spreading member, and a circuit board having a circuit that is provided on the heat spreading member and supplies power to the plurality of light emitting elements.

18 Claims, 9 Drawing Sheets

LIGHT EMITTING DEVICE AND LIGHTING FIXTURE

CROSS-REFERENCE TO RELATED APPLICATIONS

This application claims priority to Japanese Patent Applications Nos. 2013-248394 and 2014-190302 filed on Nov. 29, 2013 and Sep. 18, 2014, respectively. The entire disclosure of Japanese Patent Application s Nos. 2013-248394 and 2014-190302 is hereby incorporated herein by reference.

BACKGROUND

Technical Field

The present disclosure relates to a light emitting device that makes use of a light emitting element, and to a lighting fixture in which this light emitting device is used.

Related Art

A package-type light emitting device in which a plurality of light emitting elements (semiconductor light emitting elements) are mounted on a metal substrate or a ceramic substrate in a high-output type of semiconductor light source has been proposed in the past as prior art.

The finished product is incorporated in a lighting fixture in which one or more of these light emitting devices are used, a heat dissipation path is set up so that the heat generated by the light emitting elements is not trapped inside the light emitting devices, and good dielectric strength is ensured (see, JP2008-218761A).

When the conventional light emitting device discussed above is actually incorporated into a lighting fixture, the dielectric strength is lower with a metal substrate package. And with a conventional light emitting device, if an attempt is made to ensure good dielectric strength, heat dissipation performance may end up suffering if an insulating sheet is sandwiched at the rear face of the light emitting device, for example. Also, with a conventional light emitting device, the sheet surface area has to be large enough to achieve an adequate creepage distance to the end of the metal substrate, and this hampers efforts to make the device more compact, and makes it difficult to achieve both good heat dissipation and good dielectric strength.

Meanwhile, with a ceramic substrate package with high dielectric strength, the higher is the output, the lower is the thermal conductivity, and consequently heat can become trapped inside the light emitting device, which is a problem in that it reduces efficiency and shortens the service life.

Also, just as with a metal substrate package, raising the dielectric strength requires a larger creepage distance from the power supply terminal to the ceramic substrate end face, and this makes it harder to reduce the size.

In view of this, there has also been disclosed a light emitting device that is more compact and has a discharge suppressor that increases the creepage distance on the mounting board on which the light emitting element is mounted see, JP2013-38430A). With this light emitting device, a discharge suppressor is formed so as to gain creepage distance by providing fine texturing around the periphery of the board on which the light emitting element is mounted. Also, with this light emitting device, the mounting board that is used is installed in a metal body formed by aluminum die casting, for example.

With a conventional light emitting device, the mounting board is preferably made of a ceramic member that has good insulation properties, has at least a certain level of thermal conductivity, and is low in cost, such as alumina. With a conventional light emitting device, however, the thermal conductivity of the ceramic material used for the mounting board is only about ⅓ to 1/20 that of a metallic material, so particularly in applications where a high output (10 W or higher) is applied, if the light emitting element and the light emitting device are directly mounted to a mounting board such as this, heat dissipation will be unsatisfactory, and performance and service life will suffer. In addition, with a conventional light emitting device, if the alumina substrate used as the mounting board is made thinner in order to lower thermal resistance, the brittleness that is characteristic of ceramics can result in warping, sagging, and other such problems.

Also, with a conventional light emitting device, it has been said that a plurality of walls are provided in a protruding shape, or fine recess portions are made, so as to surround the board surface in order to gain creepage distance, but fine machining of a board surface is difficult and can increase the risk of cracking or chipping, so the desired creepage distance may not be achieved.

Also, with a conventional light emitting device, to ensure heat dissipation, as discussed above, the board thickness has to be reduced, which means that any grooves made in that board cannot be as deep, so the creepage distance has to be gained by the height of the protruding walls. Raising the wall height is disadvantageous in terms of cost and workability, and also leads to lower light emission efficiency due to blockage of light in the lateral direction of the light emitting element.

SUMMARY

The present disclosure relates to a light emitting device. The light emitting device has a plurality of light emitting elements, a heat spreading member on which the plurality of light emitting elements are mounted, and having a bottom face, an insulating member having a recess portion that includes side walls and a bottom wall, a top face of the bottom wall being in contact with the bottom face of the heat spreading member, and a circuit board having a circuit that is provided on the heat spreading member and supplies power to the plurality of light emitting elements.

Further, the present disclosure relates to a lighting fixture. The lighting fixture has the above mentioned light emitting device.

The light emitting device pertaining to the present disclosure affords both good heat dissipation and good dielectric strength to be achieved, even when the device is used as a high-output light source in which a plurality of light emitting elements are mounted at high density by providing the light emitting elements and the circuit board over the heat spreading member, and fitting the heat spreading member inside the recess portion of the insulating member.

DETAILED DESCRIPTION

Figure 1:
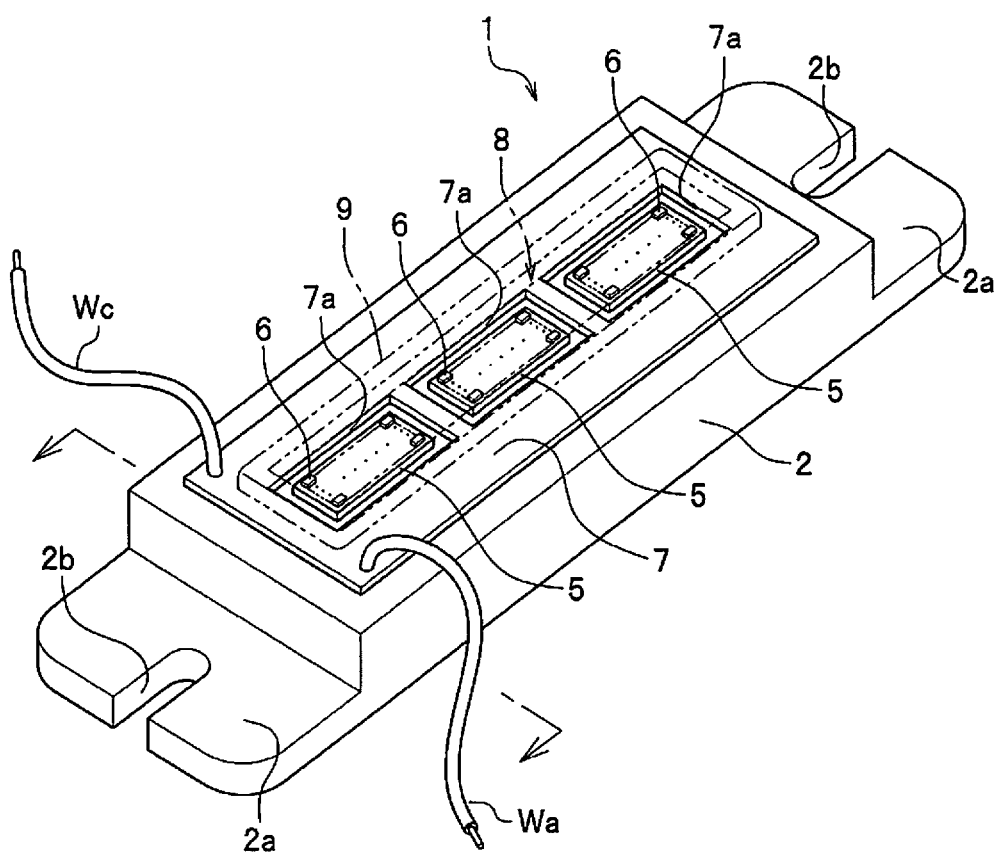
FIG. 1 is a simplified oblique view of the overall light emitting device pertaining to the present disclosure.

In the following embodiment, however, the light emitting device and the lighting fixture that embody the technological concept of the present disclosure are just examples, and unless otherwise specified, the dimensions, materials, shapes, relative layout, and so forth of the constituent parts discussed in the embodiment are not intended to limit the scope of the present disclosure, and are merely examples given for the sake of illustration. Further, constitutions described in examples and the embodiments can be employed in other examples and embodiments. The sizes and the arrangement relationships of the members in each of drawings are occasionally shown exaggerated for ease of explanation. Moreover, in the description below, the same designations or the same reference numerals may, in principle, denote the same or like members and duplicative descriptions will be appropriately omitted.

Figure 2:
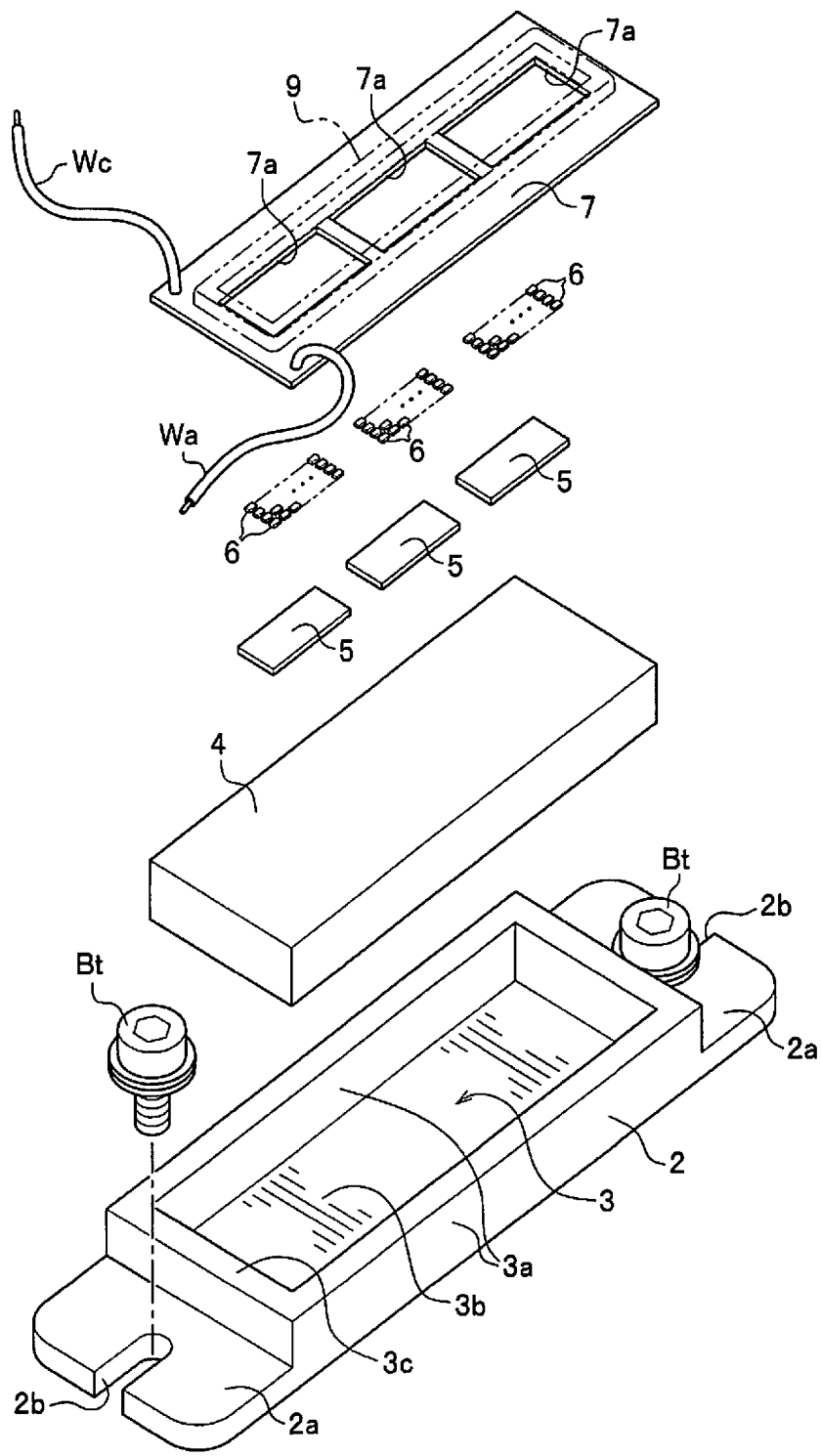
FIG. 2 is an exploded, simplified oblique view of the light emitting device pertaining to the present disclosure.

As shown in FIGS. 1 and 2, a light emitting device 1 has an insulating member 2 equipped with a recess portion 3, a heat spreading member 4 that fits with the recess portion 3 of the insulating member 2, submounts 5 provided over this heat spreading member 4, light emitting elements 6 provided on these submounts 5, and a circuit board 7 that is installed on the heat spreading member 4 and around the submounts 5, and is connected via wires Ws (see FIG. 3A) from the light emitting elements 6. The light emitting device 1 is configured, for example, so that a plastic frame 9 is provided around the edge of the circuit board 7, and the inside of this plastic frame 9 is sealed with a translucent resin 8.

Insulating Member

The insulating member 2 ensures the proper creepage distance from the mounting member on which the light emitting device is mounted, to the light emitting elements 6 and the circuit board 7, and also serves as a housing for the device. This insulating member 2 needs to be made from a material that has good dielectric strength and whose thermal conductivity is relatively high for an insulating substance, and preferably a material with high heat resistance and a low coefficient of thermal expansion. A ceramic can be used to good advantage. Examples of an insulating material for the insulating member 2 include aluminum, aluminum nitride, silicon nitride, silicon carbide.

As shown in FIGS. 1 to 3A and 3B, the insulating member 2 here has the recess portion 3, which includes side walls and a bottom wall and in which the region bounded by the side walls and the bottom wall is cuboid in shape, and flanges 2a formed to the outside of the side walls 3c of the recess portion 3, which form the ends in the lengthwise direction of the recess portion 3. The recess portion 3 houses and is joined to the heat spreading member 4 as discussed below, and when they are joined, the bottom face of the heat spreading member 4 is in contact with the top face of the bottom wall 3b of the recess portion 3. The insulating member 2 is formed so as to fit with the heat spreading member 4. The side walls 3a of the recess portion 3 are formed along the side faces of the heat spreading member 4 and extends to the top faces, and here they are formed so that the top faces of the side walls 3a lie in the same plane as the top face of the heat spreading member 4.

The insulating member 2 preferably also is formed in an overall case-like shape in which the flanges 2a and the recess portion 3 are integrated. Attachment grooves, attachment holes, or other such attachment components 2b are formed in the flanges 2a so as to allow a lighting fixture 30 (discussed below) to be directly fixed in a specific location with fixing bolts Bt.

The recess portion 3 is for mating with the heat spreading member 4. This recess portion 3 is preferably formed so that the thickness of the bottom wall 3b is reduced, to ensure dielectric strength of about AC 5 kV, which is what is required when the lighting fixture (see FIG. 7A) is used as an exterior light, and to hinder thermal conduction as little as possible. When alumina is used as the insulating member 2, for example, the bottom wall 3b preferably has a thickness of at least 0.3 mm and no more than 1 mm. Since the insulating member 2 is formed in a box-like case shape, as opposed to a flat sheet of alumina, strength will be adequate even though the bottom wall 3b is made thinner, and splitting, warping, sagging, and the like can be avoided.

Figure 3A:
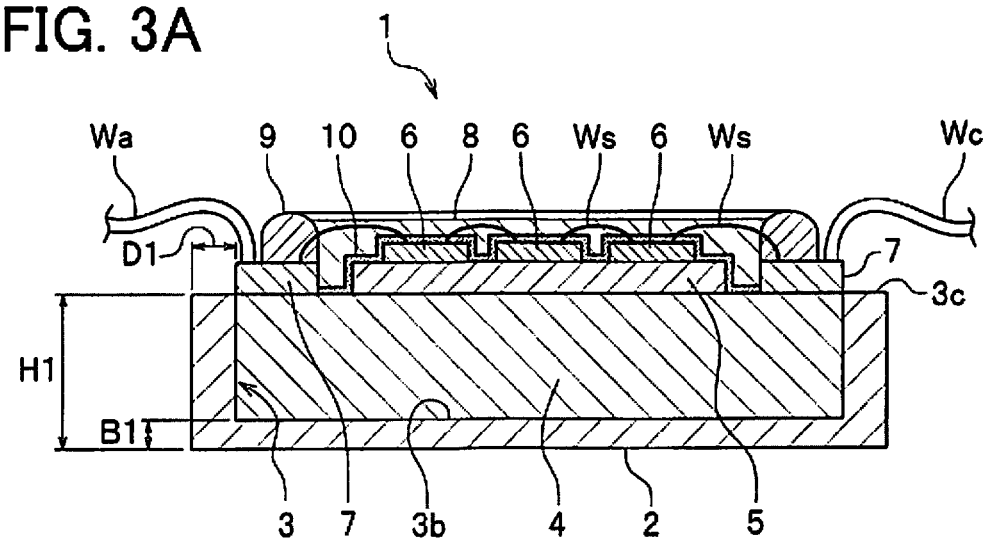
FIGS. 3A to 3B are a simplified cross section of the light emitting device pertaining to the present disclosure, with FIG. 3A being a simplified cross section that has been cut in the short-side direction, and FIG. 3B a simplified detail cross section of the heat dissipation direction, with part of the device enlarged.

As shown in FIG. 3A, with the insulating member 2, since the electroconductive material used for the heat spreading member 4 fits inside the recess portion 3, a dielectric strength of about AC 5 kV can be ensured by setting the sum of the side wall height H1 and the side wall top face width D1 of the recess portion 3 to at least 5 mm. Since there will be no effect on heat dissipation performance in the insulating member 2 even if the side wall top face width D1<the side wall height H1, the top face surface area of the device can be reduced, affording a more compact size. Here, the insulating member 2 is configured so that the bottom wall thickness B1<the side wall top face width D1<the side wall height H1.

Figure 3B:
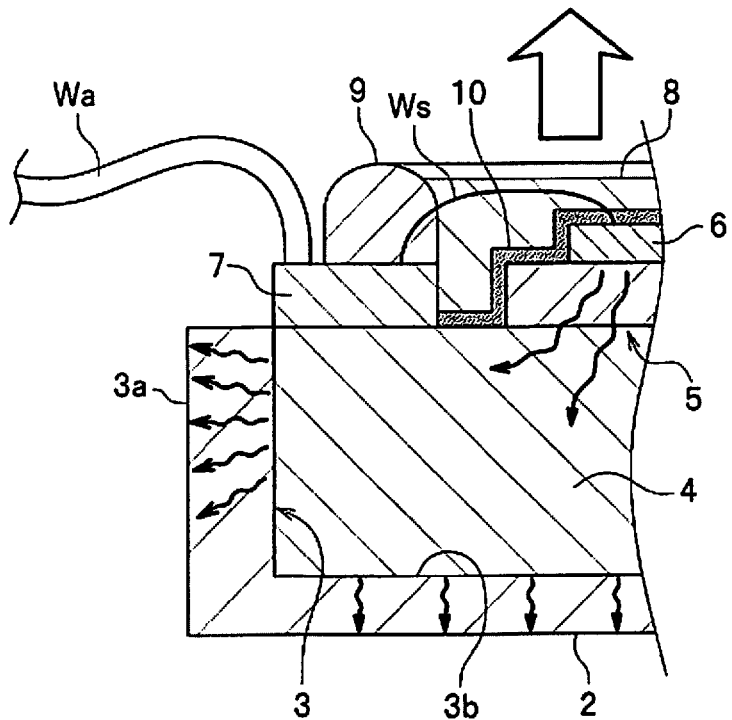

As shown in FIGS. 3A and 3B, the recess portion 3 is configured so that the thickness of the side walls 3a is greater than the thickness of the bottom wall 3b (B1<D1. Making the side walls 3a a bit thicker improves the efficiency of heat dissipation into the air. More specifically, heat from the heat spreading member 4 is captured and temporarily stored, then diffused within the side walls, allowing the heat to be efficiently dissipated to the outside. Also, the side walls 3a raise the efficiency of diffused heat dissipation by transmitting the heat over a wide range on the metal housing 30a side of the lighting fixture 30 discussed below (see FIG. 7), and also allow the creepage distance to be increased. Also, because the bottom wall 3b is thinner than the side walls 3a, diffused heat dissipation efficiency can be increased by rapidly transmitting heat to heat dissipation fins 34 of the lighting fixture 30 discussed below (see FIG. 7).

Heat Spreading Member

As shown in FIGS. 2, 3A and 3B, the heat spreading member 4 here is formed in a three-dimensional shape in which the top and bottom faces have the same shape, and more specifically in a cuboid shape. The side faces and bottom face of the heat spreading member 4 are formed as flat faces so as to fit with the recess portion 3 of the insulating member 2 and are in contact with the inner faces of the side walls 3a of the recess portion 3 and the bottom wall 3b of the recess portion 3, respectively. The heat spreading member 4 is formed so that its thickness is equal to or greater than the depth of the recess portion 3 of the insulating member 2. With this configuration, heat can be efficiently dissipated from the heat spreading member 4 to the insulating member 2.

The heat spreading member 4 is preferably made of a material with high thermal conductivity, such as aluminum, copper, or alloys of these. Furthermore, when reliability of the joint with the insulating member 2 or the submounts 5 is taken into account, a material with high thermal conductivity and a low coefficient of thermal expansion is preferable, such as a Cu—Mo laminate material, an Al—C composite material, an Al—SiC composite material, or the like. In particular, when an Al—C composite material is used as the heat spreading member 4, since there will be anisotropy in the thermal conductivity, a decrease in thermal density at the bottom face can be promoted by using the direction of high thermal conductivity as the thickness direction, which is preferable in terms of being able to further improve heat dissipation.

As discussed below, the heat spreading member 4 has mounted on it a plurality of light emitting elements 6 that are bunched together, and even when a high output (10 W or higher) is applied, heat diffusion motion from the top face of the heat spreading member 4 to the bottom face allows the thermal density at the bottom face to be kept sufficiently low. Accordingly, depending on the thermal conduction characteristics of the heat spreading member 4, the effect whereby thermal resistance is increased by the insulating member 2 that is in contact at the next stage can be kept to a minimum. Therefore, the output of the light emitting device 1 can be higher while the emission surface area remains small, so light distribution control can also be enhanced.

The heat spreading member 4 is preferably made from a material whose thermal conductivity is at least 100 W/(m·K). Furthermore, the heat spreading member 4 preferably has a thickness that allows for uniform diffusion of the heat from the light emitting elements 6 mounted on the top face, over the bottom face, such as a thickness of at least 3 mm.

The insulating member 2 and the heat spreading member 4 are preferably joined at the top face of the bottom wall 3b of the recess portion 3 and the bottom face of the heat spreading member 4, and have a large contact surface area. Therefore, to achieve contact, it is preferable to use thermosetting high-thermal conductivity silicone, SnAg(Cu) solder, eutectic AuSn, eutectic AlCu, or another such joining material (not shown). Also, by suitably adjusting the viscosity and usage amount of the joining material, it is possible to promote adhesion by the joining material all the way to the side face portions, by means of a creep effect when the heat spreading member 4 is mated with the recess portion 3. Also, when the joining material creeps to the side face portions, there will be good contact in that region between the insulating member 2 and the heat spreading member 4.

Because the height of the top face of the heat spreading member 4 is equal to or greater than the depth of the recess portion 3 of the insulating member 2, not only is it easier to apply pressure during joining to the insulating member 2, but the light of the light emitting elements 6 mounted on the top face of the heat spreading member 4 will not be blocked by the insulating member 2, so light extraction efficiency can be improved.

Submount

As shown in FIGS. 1 to 3A and 3B, the submounts 5 are joined to the top face of the heat spreading member 4, and are used to mount the light emitting elements 6. These submounts 5 are preferably formed in a rectangular shape and from a material with high thermal conductivity.

The submounts 5 are preferably members that have high thermal conductivity, have a low coefficient of thermal expansion, and lend themselves to high planar precision. Examples of the material for the submount include silicon, aluminum nitride, silicon nitride, and silicon carbide.

The submounts 5 are preferably made thin enough to rapidly transmit heat to the heat spreading member 4 at the next stage. The submounts 5 are preferably about 0.2 to 1 mm thick, for example.

If the top face of the heat spreading member 4 is not flat enough, the submounts 5 can be joined to the heat spreading member 4 via a joining member, which cancels out the unevenness of the top face of the heat spreading member 4. A light reflecting film, such as one made of white resin, for example, is preferably provided to the light emitting element mounting surface.

Silver paste, SnAg(Cu) solder, eutectic AnSn, a sintered silver material, or another such joining member is used at the joint between the submounts 5 and the heat spreading member 4. Also, a surface treatment such as plating is preferably performed on the joint face as needed and according to the joining member and method.

Light Emitting Elements

The light emitting elements 6 are preferably light emitting diodes, the wavelength of which can be suitably selected as dictated by the application. The light emitting elements 6 here are provided in a two-dimensional array, vertically and horizontally, on the submounts 5, and electrically connected to the circuit board 7 by connecting wires Ws (see FIG. 3A). These light emitting elements 6 can be a nitride semiconductor for use as blue light emitting elements 6, for example. The light emitting elements 6 may have a structure in which a p electrode is provided on one side of the top face and an n electrode is provided on the other side, or a structure that involves flip-chip mounting, or may be light emitting elements with a counter electrode structure. There are no particular restrictions on the composition, emission color, size, and so forth of the light emitting elements, which can be suitably selected as dictated by the application.

The circuit board 7 is used to supply power to the light emitting elements 6 from an external power supply (not shown). This circuit board 7 has openings 7a in its middle that pass through the board in a rectangular shape, and are spaced apart by a specific distance. The openings 7a in the circuit board 7 are formed to correspond to the number of submounts 5. The openings 7a in the circuit board 7 are formed in a size that allows the submounts 5 to be brought into contact with the heat spreading member 4.

With this circuit board 7, there are a plurality of connecting wires Ws that are connected to the outside of the various light emitting elements 6, forming wiring that allows power to be supplied to all of the light emitting elements 6 through the connecting wires Ws. The circuit board 7 is provided with external connecting wires We and Wa that are connected to an external power supply. The circuit board 7 is installed on the heat spreading member 4 so as to come into contact with the heat spreading member 4 via a joining material. The circuit board 7 is configured so that current does not flow to the face in contact with the heat spreading member 4, and is formed in approximately the same thickness as the submounts 5. The joining material used here may be the joining member that joins the submounts 5, or may be any other commonly used material.

Fluorescent Substance

As shown in FIGS. 3A and 3B, a fluorescent substance 10 is contained in the translucent resin that covers the light emitting elements 6, and covers the light emitting elements 6 in layer form. There be just one type of fluorescent substance 10, or more than one. Any known fluorescent substance can be used, taking into account the wavelength of the light emitted by the light emitting elements 6 being used, the color of light to be obtained, and so forth. Example of the fluorescent material includes, for example, a yttrium aluminum garnet (YAG) fluorescent material activated by cerium, Lutetium aluminum garnet (LAG) fluorescent material activated by cerium, a calcium aluminosilicate containing nitride fluorescent material activated by europium and/or chromium ($CaO-Al_2O_3-SiO_2$), a silicate fluorescent material activated by europium $(Sr, Ba)_2SiO_4$), beta sialon fluorescent material, KSF fluorescent material ($K_2SiF_6$:Mn), minute semiconductor particles that are termed quantum dot fluorescent material, and the like. Consequently, the light emitting device can be one that emits mixed-color light (such as white light) of primary and secondary light of a visible wavelength, or can be one that emits secondary light of a visible wavelength by excitation of primary ultraviolet light. It is particularly favorable to use a phosphor that exhibits broad emission of yellow by excitation with blue, as a phosphor that emits white light by combination with a blue light emitting element.

The fluorescent substance 10 may be a combination of a number of different types of phosphor. Examples of the fluorescent substance 10 include $Si_{6-z}Al_zO_zN_{8-z}$:Eu, $Lu_3Al_5O_{12}$:Ce, $BaMgAl_{10}O_{17}$:Eu, $BaMgAl_{10}O_{17}$:Eu,Mn, (Zn,Cd)Zn:Cu, $(Sr,Ca)_{10}(PO_4)_6C_{12}$:Eu,Mn, $(Sr,Ca)_2Si_5N_8$:Eu, $CaAlSiB_xN_{3+x}$:Eu, $K_2SiF_6$:Mn and $CaAlSiN_3$:Eu. Color rendering and color reproduction can also be adjusted by varying the combinations and blend ratios of the fluorescent substance 10 according to the desired coloring.

The fluorescent substance 10 around the light emitting elements 6 may be the result of settling/dispersion simultaneously with sealing by mixing a fluorescent substance into a translucent resin, or a sheet material or the like formed by premising a fluorescent substance into a translucent resin may be joined to the top face of the translucent resin 8. The substance may be dispersed by spray coating or the like before resin sealing.

Given the above configuration of the insulating member 2, the heat spreading member 4, etc., since the light emitting elements 6 are mounted at a position where the thickness is at least 3 mm, the proper height of the light emitting face can be obtained. This improves light utilization efficiency and light distribution control in the secondary optical system of the lighting fixture 30 discussed below (see FIG. 7), and provides greater latitude in the fixing method and layout of the secondary optical system, or affords a margin of installation error.

As shown in FIGS. 3A and 3B, the translucent resin 8 protects the light emitting elements 6. This translucent resin 8 is formed from a known substance capable of transmitting light emitted by the light emitting elements 6 and light changed by the fluorescent substance 10. The translucent resin 8 is provided by forming the plastic frame 9 around it, and filling the inside thereof. There are no restrictions on the plastic used for the plastic frame 9, as long as it is a known substance with the same composition as the translucent resin 8. The translucent resin 8 is provided in the configuration described here, but does not have to be provided.

When this light emitting device 1 emits light, a switch (not shown) is thrown in a state in which the device is connected to an external power supply via the external connecting wires Wa and Wc, whereupon light is released from the light emitting elements 6 (the white arrow in FIG. 3B). When the fluorescent substance 10 is provided to the light emitting device 1, light is converted by the fluorescent substance 10 and then released to the outside. With the light emitting device 1, since the circuit board 7 is provided to the top face of the heat spreading member 4 at a position that is on the inside of the side walls 3a of the recess portion 3, a longer creepage distance can be obtained, and there will be no short-circuiting even when high voltage is required.

As shown in FIG. 3B, with the light emitting device 1, when heat is generated through the use of the light emitting elements 6, this heat is transmitted to the submounts 5 as indicated by the arrows, and from the submounts 5 is transmitted to the heat spreading member 4. There are mainly two types of heat transmitted to the heat spreading member 4, that which goes to the bottom wall 3b side of the recess portion of the insulating member 2, and that which goes to the side wall 3a side of the recess portion 3. Heat transmitted from the heat spreading member 4 to the bottom wall 3b side of the recess portion 3 is transmitted instantly to whatever is connected to the rear face of the bottom wall 3b (metal, etc.) since the bottom wall 3b of the recess portion 3 is formed thinner. Heat transmitted from the heat spreading member 4 to the side wall 3a side of the recess portion 3 diffuses through the side walls since the side walls 3a of the recess portion 3 are thicker than the bottom wall 3b of the recess portion 3. Therefore, with the light emitting device 1, heat generated from the light emitting elements 6 and transmitted from the heat spreading member 4 to the side walls 3a of the recess portion 3 and to the bottom wall 3b of the recess portion 3 can be efficiently transferred and released.

Figure 4:
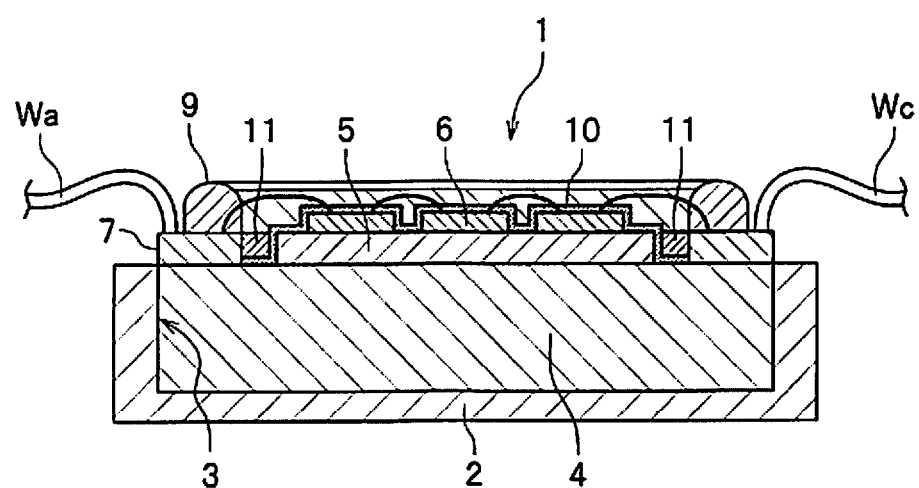
FIG. 4 is a simplified cross section of a state in which a light reflecting resin has filled the space between submounts and the circuit board of the light emitting device pertaining to the present disclosure.

An example of the light emitting device 1 was given in which a plurality (three) of the submounts 5 were used, but when the submounts 5 are used a gap may be formed between the submount 5 and the circuit board 7. When such a gap is present, the external light extraction efficiency can be improved by using a light reflecting resin 11 to fill in the gap between the submounts 5 and the circuit board 7. If the fluorescent substance 10 is formed by spray coating, some of the fluorescent substance 10 may get into the gap, but the gap should be filled with the light reflecting resin 11, as shown in FIG. 4. That is, when the fluorescent substance 10 gets into the gap, the excitation of the unnecessary fluorescent substance 10 in the gap can be suppressed by further filling the gap with the light reflecting resin 11 (containing $TiO_2$ or the like mixed into a resin) after the spray coating. This also improves the external light takeoff efficiency.

Figure 10A:
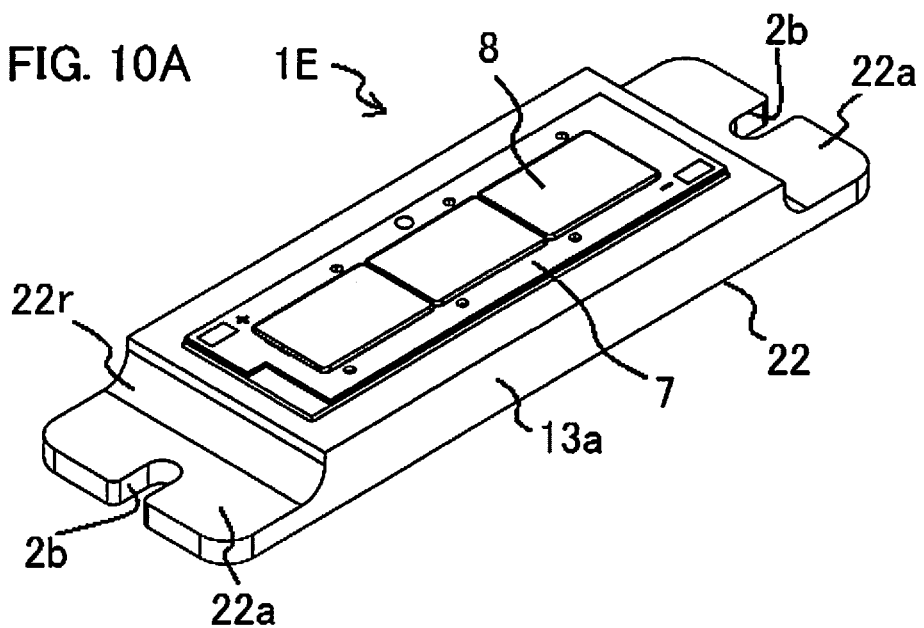
FIGS. 10A and 10B are simplified oblique views of configurations with different shapes of the flanged insulating member of the light emitting devices pertaining to the present disclosure.
Figure 10B:
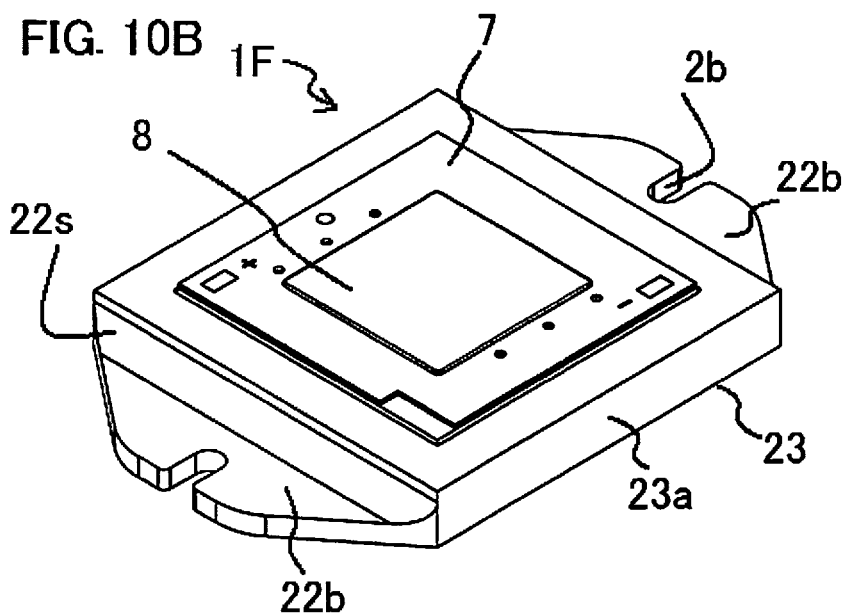

With the configuration of the light emitting device 1, the overall shape of the insulating member 22, 23 and the shape of the flanges 22a, 22b may be configured as shown in FIGS. 10A and 10B. In light emitting devices 1E and 1F as shown in FIGS. 10A and 10B, the flanges 22a, 22b have thickness portions 22r, 23r, respectively, which have the thickest at the side walls 13a, 23a sides, and the thickness of the thickness portion decreases as the distance from the side walls 13a, 23a increases. These changes of the thickness may be in a progressive or stepwise fashion. The thickness portions 22r, 23r may be an arc-like shape having a curved face on top face sides of the insulating member, or a shape having a plane face. The length of the thickness portions 22r, 23r can be about 5 to 50% with respect to the distance from the side walls 13a, 23a to these edges. For example, the thickness portions 22r, 23r preferably has a curved face on their surface. Such thickness portions 22r, 23r of the flanges 22a, 22b allow to reduce the stress applied between the side walls and the flange, thereby to reduce riskiness of breakage of the flange when the flange is screwed with using the attachment components 2b.

In a plane view, the shape of the insulating member 23, the circuit board 7, the translucent resin 8, or the plastic frame 9 and the like may be substantially square shape as shown the light emitting device 1F in FIG. 10B, in addition to the rectangle shape as shown in FIG. 2, etc. The shape of the heat spreading member or the submount 5 may be substantially square shape. There is no particular limitation to a substantially-quadrangular, the shapes may include circle, elliptical shape, polygonal shape and a combination thereof. When the plastic frame and/or the translucent resin is substantially circle, the light emitting face will be circle, it is possible to obtain a light emitting device suitable for the light fixture.

The flanges 22b may has a shape whose width decreases as the distance from the side walls 13a, 23a increases as shown the light emitting device 1F in FIG. 10B, other than has a shape having a substantially fixed length and width in the flange 2 as shown in FIG. 2. These changes of the thickness may be in a progressive or stepwise fashion. The change of the width can be within about 5 to 50% with respect to the width of side wall 23b side at the edges.

Figure 5A:
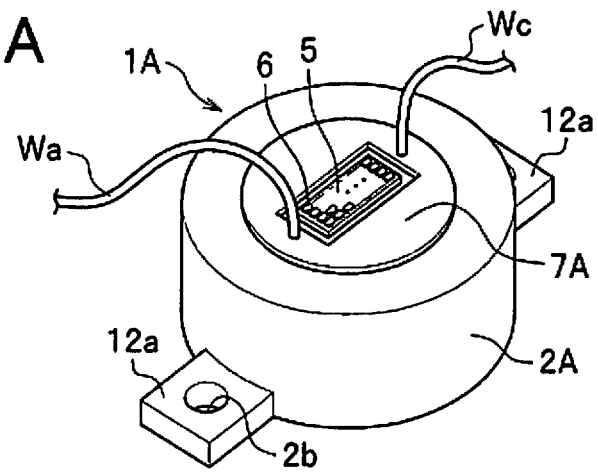
FIGS. 5A to 5C are simplified oblique views of configurations with different shapes of the flanged insulating member of the light emitting devices pertaining to the present disclosure.
Figure 5B:
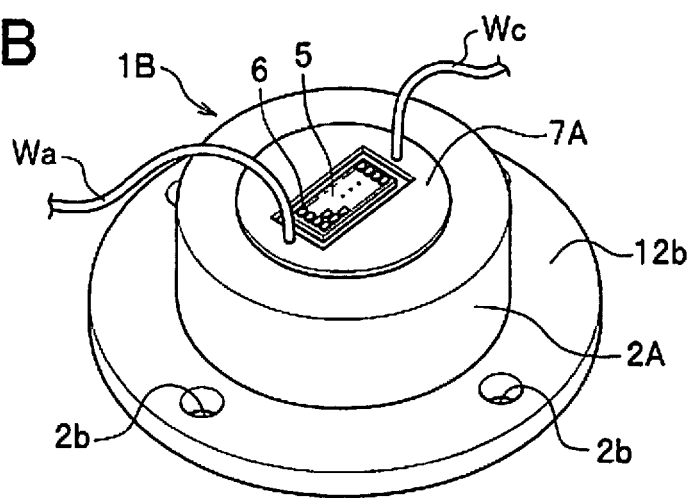
Figure 5C:
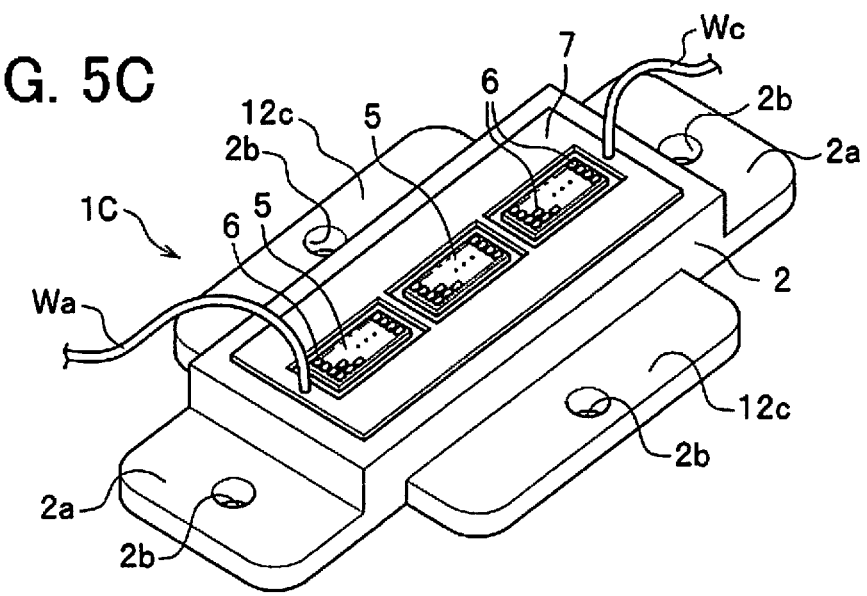

With the configuration of the light emitting device 1, the overall shape, as well as the shape and formation portions of the flanges 2a, may be configured as shown in FIGS. 5A, 5B, and 5C. In FIGS. 5A, 5B, and 5C, the external connecting wires Wa and We are disposed at positions that are opposite in the lengthwise direction of the circuit board 7 or 7A, but may instead be at positions that are opposite in the lengthwise direction of the opening, just as in FIG. 1.

As shown in FIG. 5A, a light emitting device 1A may be configured so that there is an insulating member 2A in the form of a bottomed cylinder, the relation between the bottom face of the recess portion and the side walls of the recess portion is the same as described above, and flanges 12a are provided at opposing positions. The flanges 12a here have formed in them attachment components 2b that are attachment holes that pass through in the sheet thickness direction.

As shown in FIG. 5B, a light emitting device 1B may be configured so that a flange 12b is formed all the way around the outer periphery of an insulating member 2A. The flange 12b here has attachment components 2b (attachment holes) formed on the four sides (at 90-degree intervals), equally spaced in the peripheral direction.

As shown in FIG. 5C, a light emitting device 1C may be configured so that flanges 2a and 12c are formed on all four sides of the side walls 3a of the recess portion, in the configuration already described through reference to FIG. 1. The flanges 2a and 12c have attachment components 2b (attachment holes) formed in them.

Figure 6:
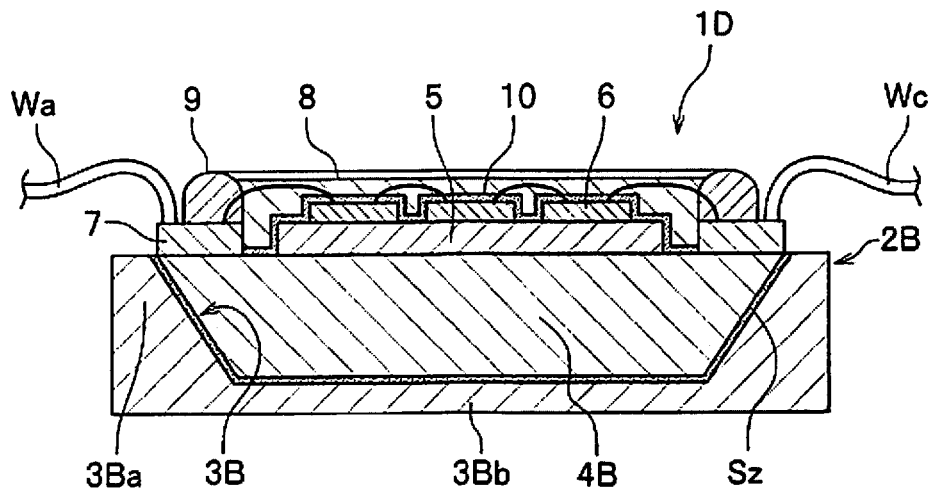
FIG. 6 is a simplified cross section of a modification example of the heat spreading member and insulating member of the light emitting device pertaining to the present disclosure.

As shown in FIG. 6, with a light emitting device 1D, the empty portion in the cross sectional shape of a recess portion 3B of the insulating member 2 may have a trapezoidal concave shape, and a heat spreading member 4B may match this concave shape. That is, the recess portion 3B is such that the outer faces of the side walls 3Ba are vertical, and the inner faces of the side walls 3Ba are sloped so that an area of the top face of the bottom wall will be smaller than the opening surface area at the top face of the insulating member 2. The heat spreading member 4B has a shape in which the side faces are sloped so as to substantially conform to the slope of the inner faces of the side walls of the recess portion 3B. The side walls 3Ba here are configured so that the thickness at the position serving as the top face is greater than the thickness of the bottom wall 3Bb.

With the light emitting device 1D, a joining member Sz can be used when the heat spreading member 4B is fitted with the recess portion 3B. When the heat spreading member 4B is fitted with the recess portion 3B, if the heat spreading member 4B is pushed in, this increases creepage of the joining material Sz, and the pressure during joining can be sufficiently applied not only to the bottom face, but also to the side faces. Therefore, with the light emitting device 1D, heat dissipation performance from the side faces can also be improved. Furthermore, this configuration affords better joint strength and reliability.

Lighting Fixture

Figure 7:
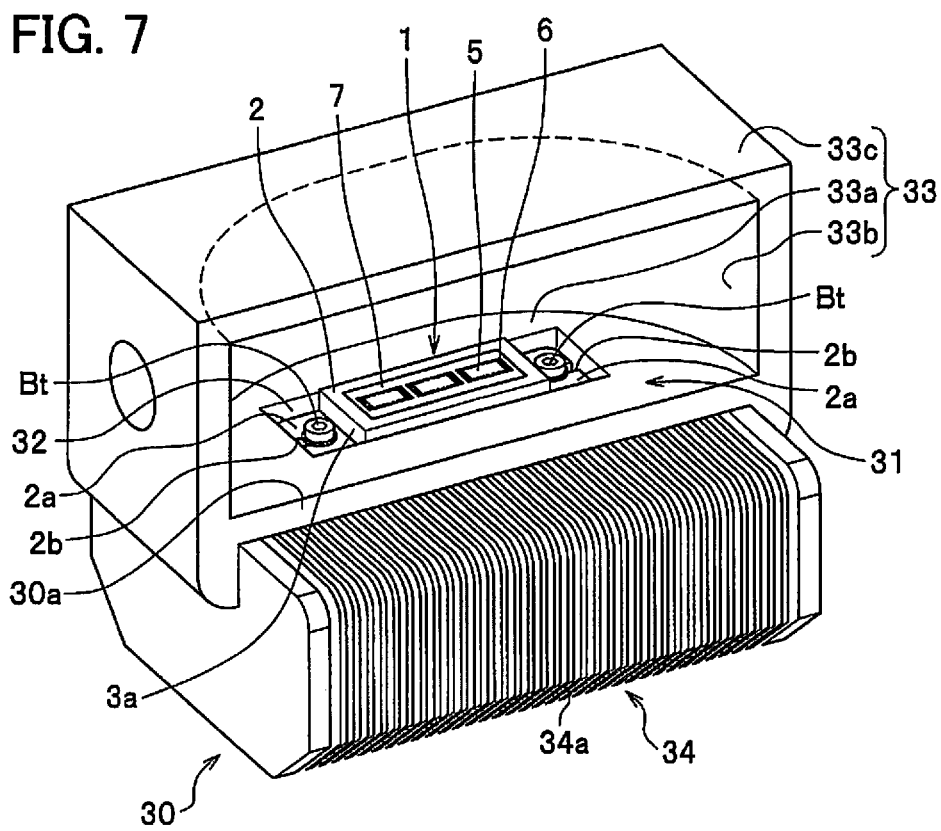
FIG. 7 is a simplified view of a lighting fixture featuring the light emitting device pertaining to the present disclosure.
Figure 8:
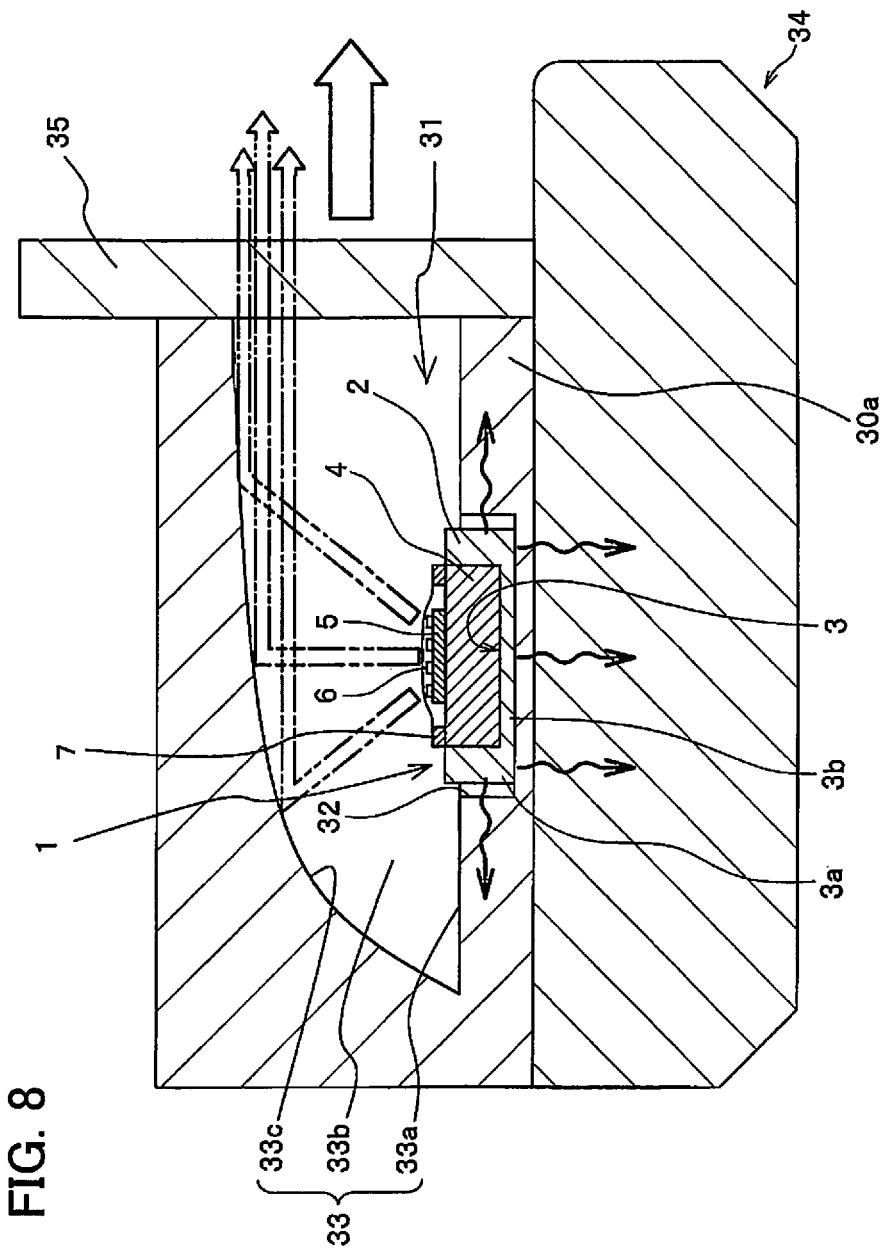
FIG. 8 is a simplified cross section passing through the light emitting device in FIG. 7, and illustrates the heat dissipation state.

As shown in FIGS. 7 and 8, the above-mentioned light emitting devices 1 to 1F may be mounted in a lamp to obtain the lighting fixture 30.

The light emitting device 1 is attached so as to be embedded in an embedded attachment component 32 of the metal housing 30a of the lighting fixture 30, and the light emitting device 1 is a lighting fixture in which the light emitting elements 6 sticks out beyond the peripheral face around the embedded attachment component 32 when attached to the embedded attachment component 32. Thus, with the lighting fixture 30, if the light emitting device 1 is provided to the embedded attachment component 32, light from the light emitting device 1 can be emitted directly to the outside. Any heat from the insulating member 2 of the light emitting device 1 will be dissipated from the embedded attachment component 32 that is in contact with the device, and because there will be some distance from the embedded attachment component 32 to the circuit board 7 on the heat spreading member 4, the resulting lighting fixture 30 will have excellent dielectric strength as well.

As shown in FIG. 7, the lighting fixture 30 mainly has the metal housing 30a to which the light emitting device 1 is attached and which sends light to the outside, and the heat dissipation fins 34 that radiate heat generated when the light emitting device 1 is on. The lighting fixture 30 is configured so that light is emitted from a light emitter 31 that opens up in the metal housing 30a. A translucent cover 35 is disposed on an open end of the metal housing 30a as shown in FIG. 8, but is omitted it in FIG. 7.

The metal housing 30a is formed in a concave shape whose opening is to the side, and from a metal such as stainless steel, an aluminum alloy, or a magnesium alloy, and this opening on the side serves as the light emitter 31. The metal housing 30a has an attachment plane 33a that serves as the bottom face, an erect face 33b that rises up from this attachment plane 33a, and a top plane 33c that is adjacent to the erect face 33b and is opposite the attachment plane 33a.

The metal housing 30a is configured so that the heat dissipation fins 34 are provided so as to be continuous from the attachment plane 33a.

The embedded attachment component 32 is the portion where the light emitting device 1 is attached. This embedded attachment component 32 is configured so that the light emitting device 1 can be removably attached to the attachment plane 33a. The attachment plane 33a, the erect face 33b, and the top plane 33c are configured as a reflector 33 that allows light from the light emitting device 1 attached to the embedded attachment component 32 to be sent out more efficiently.

As shown in FIGS. 7 and 8, the embedded attachment component 32 is configured so that threaded holes are formed at opposite positions in the attachment components 2b formed in the flanges 2a of the light emitting device 1, and the light emitting device 1 can be removably attached by fixing bolts Bt (see FIG. 2). This embedded attachment component 32 is set to a depth such that when the light emitting device 1 has been attached, the light emitting elements 6 will be at positions where they stick out beyond the attachment plane 33a (peripheral face) (positions where they stick out past the concavity opening). The embedded attachment component 32 is configured so that an external power supply means (not shown) is provided at a specific position, and the external connecting wires Wa and We are connected to the light emitting device 1.

As shown in FIG. 7, the reflector 33 is used to reflect light from the attached light emitting device 1. This reflector 33 is configured here so that light is reflected by the attachment plane 33a in which the embedded attachment component 32 is formed, the erect face 33b that rises up from this attachment plane 33a, and the top plane 33c that is adjacent to the erect face 33b and opposite the attachment plane 33a. The light reflected from the reflector 33 is outputted to the outside from the light emitter 31 (the face where the attachment plane 33a, the erect face 33b, and the top plane 33c are provided). The lighting fixture 30 allows both direct light from the light emitting device 1 and light reflected by the reflector 33 to be efficiently extracted to the outside from the light emitter 31. The reflector 33 can be configured so that it is formed from a metal material that reflects light, or so that a reflective material that reflects light is provided to its surface.

The heat dissipation fins 34 release to the outside any heat generated by the mounted light emitting device 1. These heat dissipation fins 34 here are configured so that a plurality of thin fins 34a are formed so as to release heat efficiently from the embedded attachment component 32 of the attachment plane 33a. These heat dissipation fins 34 can be formed integrally with the plate portion where the embedded attachment component 32 is formed, or can be formed separately and connected by screws or welding. There are no particular restrictions on the heat dissipation fins 34 as long as they are a type that is used in lighting devices of this type.

The following is an example of the lighting fixture 30 configured as above when the light emitting device 1 is used.

For instance, the lighting fixture 30 is such that the light emitting device 1 is mounted with the fixing bolts Bt (metal bolts) to the attachment components 2b formed in the flanges 2a. Thus, with the lighting fixture 30, attachment can be accomplished by the simple means of mounting with the fixing bolts Bt. With the lighting fixture 30, as already described, since the light emitting device 1 is configured so that the circuit board 7 is located on the heat spreading member 4, even if metal bolts are used as the fixing bolts Bt, there is no need for concern about dielectric strength with the metal housing 30a. With the lighting fixture 30, even though room is allowed for the bolt heads to stick up at the same position as the height of the insulating member 2 from the top faces of the flanges 2a, since the side walls 3a of the recess portion 3 are located higher than the bolt heads, heat dissipation is not affected, and furthermore there is no risk that light will be blocked by the light emitting elements 6 being located higher than the bolt heads.

With the lighting fixture 30, adequate heat dissipation will be possible even in mounting to the attachment plane 33a formed on the metal housing 30a, but the depth of the embedded attachment component 32 formed in the metal housing 30a as a concave hole in substantially the same dimensions as the light emitting device is no greater than the height of the light emitting device, and if the light emitting device 1 is fitted with and attached to the embedded attachment component 32, a heat dissipation path can be ensured not only from the bottom wall 3b of the recess portion 3 of the insulating member 2 to the metal housing 30a, but also from the side walls 3a of the recess portion 3 to the metal housing 30a.

The gap between the light emitting device 1 and the concave walls of the metal housing 30a can also be packed with a thermally conductive grease to directly promote heat dissipation. The lighting fixture 30 can also make use of heat exchange in which the insulating member 2 is made of a material such as alumina with high emissivity, and heat absorption is performed by the metal housing 30a at the portion where the light emitting device 1 is mounted, with the radiant heat of the alumina. The lighting fixture 30 may also be such that the metal housing 30a of the embedded attachment component 32 is adjacent to the side walls 3a of the recess portion 3 of the light emitting device 1, but because creepage distance is ensured by providing the circuit board 7 over the heat spreading member 4, there will be no problem with dielectric strength performance, either.

With the light emitting devices 1 to 1F in the embodiments of the present disclosure, a configuration that affords both good heat dissipation and good insulation can be achieved when a plurality of the light emitting elements 6 are mounted in high density.

Figure 9:
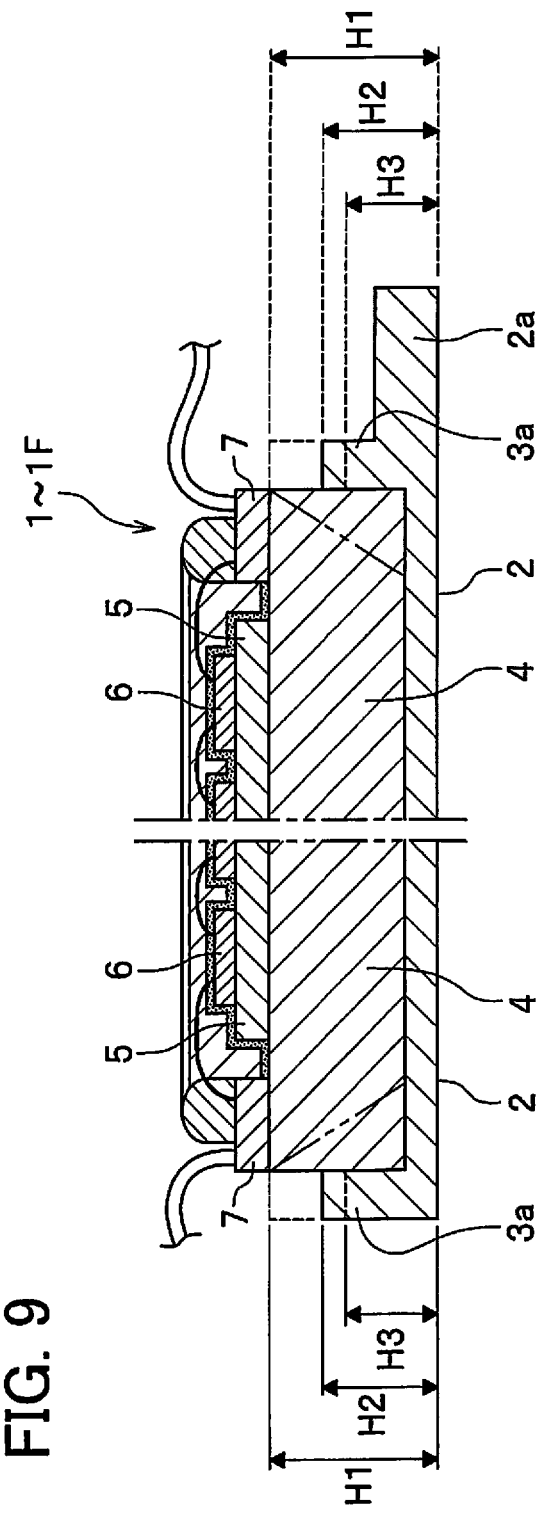
FIG. 9 is a simplified diagram illustrating the height of the side walls of a recess portion in a flanged light emitting device pertaining to the present disclosure, and illustrating the height of the side walls of a recess portion in an unflanged light emitting device.

With the light emitting devices 1 and 1A to 1F, the height of the side walls 3a and 3Ba of the recess portion 3 may be within a range of up to the top face of the heat spreading member 4 as shown in the right half of FIG. 9, such as half way up to the top face of the heat spreading member 4 (a height of H2), or a height of one-third, one-fourth, one-fifth, . . . , one-tenth (a height of H3; shown exaggerated in the drawing).

As shown in the left half of FIG. 9, no flange need be provided in the light emitting devices 1 and 1A to 1F. The height of the side walls 3a and 3Ba of the recess portion 3 in this case may be the same as, one half (height of H2), etc., as the top face of the heat spreading member, for example.

In FIG. 9, the diagram is simplified so as to show the configuration of different insulating members 2 on the left and right.

With the light emitting devices 1 to 1F, if the flatness of the top face of the heat spreading member 4 is high, then submounts need not be used for the purpose of canceling out bumps. In the light emitting devices 1 to 1F, if no submounts are used, the light emitting elements 6 may be mounted directly on the top face of the heat spreading member 4, and a highly optically reflective film may be formed between the light emitting elements 6 and the circuit board 7 (and in between the light emitting elements 6 themselves) to fill in with a reflecting member (see FIG. 4) that is the light reflecting resin 11 obtained by mixing a light reflecting filler composed of TiO$_2$ or the like into a resin. If no submounts 5 are used, a plurality of the light emitting elements 6 may be mounted directly to a flexible circuit board, and the flexible circuit board attached to the top face of the heat spreading member 4, or a plurality of light emitting devices in which one or more of the light emitting elements 6 have been packaged may be attached directly to the top face of the heat spreading member 4.

A circuit configuration or the like for supplying power to the light emitting elements 6 can be provided on the submounts 5 or on the heat spreading member 4. The insulating member 2 is such that when the light emitting device 1 is attached to the lighting fixture 30, the metal housing 30a of the lighting fixture 30 is adjacent to the side walls 3a of the recess portion 3. Therefore, the lighting fixture 30 can be ensured to have good dielectric strength by suitably adjusting the side wall top face width D1 of the recess portion 3.

INDUSTRIAL APPLICABILITY

A light emitting device according to the present disclosure can be suitably employed for various lighting fixture for a general use, for example, a base light, a spot light, a down light, and the like as well as for a commercial use, for example, a street light, a road light, a light for a parking area, a projector, a sign light, a ceiling lamp, and the like

What is claimed is:

1. A light emitting device comprising:
   a plurality of light emitting elements,
   a heat spreading member on which the plurality of light emitting elements are mounted, and having a bottom face,
   an insulating member having a recess portion that includes side walls and a bottom wall and that does not include a through hole, a top face of the bottom wall being in contact with the bottom face of the heat spreading member, and
   a circuit board having a circuit that is provided on the heat spreading member and supplies power to the plurality of light emitting elements.

2. The light emitting device according to claim 1, wherein the heat spreading member has a top face and side faces, the side walls of the recess portion are formed along the side faces of the heat spreading member and extends to the top face.

3. The light emitting device according to claim 1, wherein the thickness of the side walls is greater than the thickness of the bottom wall.

4. The light emitting device according to claim 1, wherein the insulating member has flanges formed to the outside of the side walls.

5. The light emitting device according to claim 4, wherein the flange has a thickness portion whose thickness decreases as the distance from the side wall increases.

6. The light emitting device according to claim 4, wherein each of the flanges includes an attachment groove or an attachment hole.

7. The light emitting device according to claim 1, further comprising submounts provided over the heat spreading member,
   wherein the plurality of light emitting elements are mounted on the submounts, and
   the circuit board is installed around the submounts.

8. The light emitting device according to claim 7, wherein
   a gap is formed between the submounts and the circuit board, and
   a light reflecting resin is filled in the gap between the submounts and the circuit board.

9. The light emitting device according to claim 1, wherein the heat spreading member has a top face, and is formed in a three-dimensional shape in which the top and bottom faces have the same shape.

10. The light emitting device according to claim 1, wherein
    the insulating member has a top face,
    the recess portion is configured such that inner faces of the side walls are sloped so that an area of the top face of the bottom wall is smaller than an opening surface area at the top face of the insulating member, and
    the heat spreading member has side faces, and has a shape in which the side faces are sloped so as to conform to the slope of the inner faces of the side walls of the recess portion.

11. A lighting fixture comprising the light emitting device according to claim 1.

12. The lighting fixture according to 11, further comprising
    a metal housing having an embedded attachment component,
    wherein the light emitting device is attached to the metal housing so as to be embedded in the embedded attachment component of the metal housing, and
    the light emitting elements of the light emitting device stick out beyond a peripheral face around the embedded attachment component.

13. The light emitting device according to claim 1, wherein
    a sum of a height of one of the side walls of the recess portion and a width of a top face of the one of the side walls is at least 5 mm.

14. The light emitting device according to claim 1, wherein
    a height of one of the side walls of the recess portion is larger than a width of a top face of the one of the side walls, and
    the width of the top face of the one of the side walls is larger than a thickness of the bottom wall of the recess portion.

15. The light emitting device according to claim 1, wherein
    the heat spreading member is made of Al—C composite material.

16. The light emitting device according to claim 1, wherein
    a thickness of the heat spreading member is at least 3 mm.

17. The light emitting device according to claim 1, wherein
    a height of a top face of the heat spreading member is equal to or greater than a depth of the recess portion of the insulating member.

18. The light emitting device according to claim 1, wherein
    the circuit board is disposed on the periphery of the light emitting elements.

* * * * *